United States Patent
Lee et al.

(10) Patent No.: US 8,440,018 B2
(45) Date of Patent: May 14, 2013

(54) APPARATUS FOR SUPPLYING SOURCE AND APPARATUS FOR DEPOSITION THIN FILM HAVING THE SAME

(75) Inventors: Kyoo Hwan Lee, Gyeonggi-Do (KR); Hyung Sup Lee, Gyeonggi-Do (KR)

(73) Assignee: Jusung Engineering Co., Ltd. (KR)

( * ) Notice: Subject to any disclaimer, the term of this patent is extended or adjusted under 35 U.S.C. 154(b) by 377 days.

(21) Appl. No.: 12/467,217

(22) Filed: May 15, 2009

(65) Prior Publication Data

US 2009/0288600 A1 Nov. 26, 2009

(30) Foreign Application Priority Data

May 23, 2008 (KR) .................. 10-2008-0048016

(51) Int. Cl.
*C23C 16/00* (2006.01)
(52) U.S. Cl.
USPC ........... 118/715; 118/308; 118/309; 118/719; 222/344
(58) Field of Classification Search ................ None
See application file for complete search history.

(56) References Cited

U.S. PATENT DOCUMENTS

| | | | |
|---|---|---|---|
| 5,574,955 A * | 11/1996 | Stromgren et al. ............ 419/30 |
| 5,651,401 A * | 7/1997 | Cados ........................... 141/129 |
| 6,386,433 B1 * | 5/2002 | Razon et al. .................. 228/246 |
| 6,482,266 B1 | 11/2002 | Matsumoto et al. |
| 6,627,160 B2 * | 9/2003 | Wanner ......................... 422/501 |
| 2006/0185586 A1 * | 8/2006 | Durr et al. .................... 118/309 |

FOREIGN PATENT DOCUMENTS

| | | |
|---|---|---|
| EP | 0696472 A1 | 2/1996 |
| JP | 2008-038243 | 2/2008 |

* cited by examiner

*Primary Examiner* — Robert Xu
(74) *Attorney, Agent, or Firm* — Renaissance IP Law Group LLP

(57) ABSTRACT

The present invention provides an apparatus for supplying a source and an apparatus for depositing a thin film having the same. The apparatus for supplying a source includes a horizontal channel extending in one direction; pumping and transfer ports extending to pass through the horizontal channel, the pumping and transfer ports being spaced apart from each other; a transfer shaft inserted into the horizontal channel to reciprocate therein; and a storage room connected to one side of the pumping port, the storage room storing and supplying a powder source, wherein the transfer shaft comprises at least one transfer hole for allowing the powder source supplied through the pumping port to be filled therein and to be transferred to an external apparatus through the transfer port. As described above, according to the present invention, a powder source filled in a transfer hole is supplied to an external apparatus by reciprocating a transfer shaft, so that the amount of the powder source supplied to the external apparatus can be quantitatively controlled as much as a fixed quantity corresponding to the internal volume of the transfer hole.

11 Claims, 5 Drawing Sheets

APPARATUS FOR SUPPLYING SOURCE AND APPARATUS FOR DEPOSITION THIN FILM HAVING THE SAME

This application claims priority to Korean Patent application No. 10-2008-0048016, filed on May 23, 2008 and all the benefits accruing therefrom under 35 U.S.C. 119, the contents of which are herein incorporated by reference in its entirety.

BACKGROUND OF THE INVENTION

1. Field of the Invention

The present invention relates to an apparatus for supplying a source and an apparatus for depositing a thin film having the same, and more particularly, to an apparatus for supplying a source, which can quantitatively supply a powder source that is a deposition material, and an apparatus for depositing a thin film having the same.

2. Description of the Related Art

In general, methods for forming a thin film are classified into physical vapor deposition (PVD) methods, such as a sputtering method for forming a thin film using physical bombardment, and chemical vapor deposition (CVD) methods for forming a thin film using chemical reaction.

In the CVD method, a thin film is generally deposited using a reaction source in a gas state. However, when it is difficult to prepare a reaction source in a gas state since heavy elements with large atomic weight are contained in a reaction source, a thin film is deposited using a source gas evaporated after evaporating a powder source in a solid state. For example, in an organic light emitting diode (OLED), an organic thin film which functions as a light emitting layer is deposited using a powder source in a solid state. Therefore, an apparatus for depositing an organic thin film using a CVD method is generally provided with at least one apparatus for supplying a source, which supplies a powder source stored in an additional canister into a chamber.

Meanwhile, in a general apparatus for supplying a source, a powder source stored in a canister is supplied into a chamber by a method using a pressure difference or a method using a screw thread. First, in the method using a pressure difference, a pressure difference is generated between a canister and a chamber by injecting a first gas into the canister, and a powder source is then discharged to the outside of the canister due to the pressure difference and supplied into the chamber. Accordingly, the supply amount of the powder source is controlled by the injection pressure of the first gas. However, such a method has a problem in that the supply amount of the powder source is frequently changed due to the influence of the amount and kind of the powder source remaining in the canister, moisture, static electricity and the like. On the other hand, in the method using a screw thread, a rotary shaft having a screw thread is installed in a canister and is rotated, and a powder source is supplied into a chamber by allowing the powder source to be discharged to the outside of the canister along the screw thread by the rotation of the rotary shaft. Accordingly, the supply amount of a powder source is controlled by the pitch and rotational speed of the screw thread. However, this method has a problem in that if particles of the powder source are fine, the powder source is stuck between the screw thread and an inner wall of the canister so that the powder source cannot be supplied into the chamber. Thus, it is not suitable for supplying a very small amount of a powder source into the chamber, and the supply amount of a powder source also varies every time.

As described above, in conventional apparatuses for depositing an organic thin film, it is difficult to quantitatively supply a source that is a deposition material, and it is more difficult to supply a very small amount of the source correctly. Thus, it is difficult to control the thickness of a thin film to be uniform, and the quality of the thin film is degraded, thereby making it difficult to stably perform a thin film deposition process.

SUMMARY OF THE INVENTION

The present invention provides an apparatus for supplying a source, wherein a powder source filled in a transfer hole is supplied to an external apparatus by reciprocation of a transfer shaft so that the amount of the powder source supplied to the external apparatus can be controlled quantitatively by the quantity corresponding to the internal volume of the transfer hole, and an apparatus for depositing a thin film having the same.

The present invention also provides an apparatus for supplying a source, wherein a very small amount of powder source is quantitatively supplied so that a thin film deposition process can be stably performed, and an apparatus for depositing a thin film having the same.

According to an aspect of the present invention, there is provided an apparatus for supplying a source, including a horizontal channel extending in one direction; pumping and transfer ports extending to pass through the horizontal channel, the pumping and transfer ports being spaced apart from each other; a transfer shaft inserted into the horizontal channel to reciprocate therein; and a storage room connected to one side of the pumping port, the storage room storing and supplying a powder source, wherein the transfer shaft includes at least one transfer hole for allowing the powder source supplied through the pumping port to be filled therein and to be transferred to an external apparatus through the transfer port.

The apparatus may further include a pumping unit connected to the other side of the pumping port to form discharge pressure.

A valve for controlling discharge flow of the powder source is preferably installed between the pumping port and the pumping unit.

The apparatus may further include a gas supply unit connected to one side of the transfer port to supply a gas for transferring the powder source.

A first sealing member is preferably installed on an outer circumferential surface of the transfer shaft inserted into the horizontal channel, and a second sealing member is preferably installed on an outer side of an end of the horizontal channel into which the transfer shaft is inserted.

The transfer shaft is preferably formed of a ceramic or teflon material.

The apparatus may further include a reciprocating driving unit connected to one end of the transfer shaft and reciprocally driving the transfer shaft.

The reciprocating driving unit preferably includes a pneumatic piston member.

The apparatus may further include a gas supply unit for supplying a gas for discharging the powder source into the storage room.

The apparatus may further include a heating member for heating at least one of the storage room and the gas supply unit.

The heating member preferably has a heating temperature of 100° C. or higher.

According to another aspect of the present invention, there is provided an apparatus for depositing a thin film, which includes a chamber for forming a thin film on a substrate; and a source supply unit for supplying a powder source filled in a transfer hole to the chamber by reciprocating a transfer shaft having the transfer hole formed therein.

The source supply unit may include a horizontal channel extending in one direction; pumping and transfer ports extending to pass though the horizontal channel, the pumping and transfer ports being spaced apart from each other; a transfer shaft inserted into the horizontal channel to reciprocate therein; and a storage room connected to one side of the pumping port, the storage room storing and supplying a powder source.

The apparatus may further include a pumping unit connected to the other side of the pumping port to form discharge pressure.

The apparatus may further include a gas supply unit connected to one side of the transfer port to supply a gas for transferring the powder source.

The apparatus may further include a gas supply unit for supplying a gas for discharging the powder source into the storage room.

BRIEF DESCRIPTION OF THE DRAWINGS

Preferred embodiments of the present invention can be understood in more detail from the following description taken in conjunction with the accompanying drawings, in which.

DETAILED DESCRIPTION OF THE INVENTION

Figure 1:
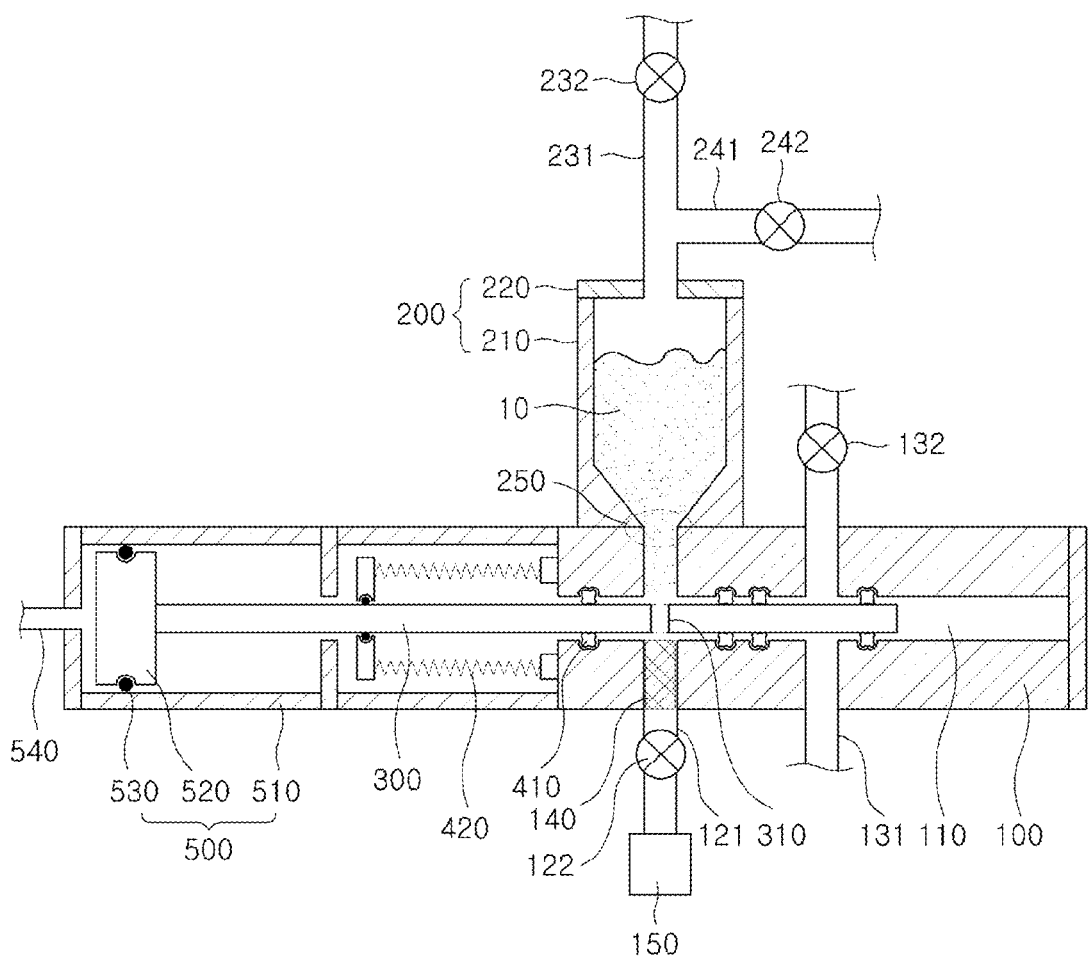
FIG. 1 is a schematic view of an apparatus for supplying a source according to a first embodiment of the present invention.

Hereinafter, exemplary embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art. Throughout the drawings like reference numerals are used to designate like elements.

<First Embodiment>

FIG. 1 is a schematic view of an apparatus for supplying a source according to a first embodiment of the present invention.

Referring to FIG. 1, the apparatus for supplying a source includes a transfer block 100 having a horizontal channel 110 extending in one direction and a pumping port 121 and a transfer port 131, which pass through the horizontal channel 110 to extend in the other direction and are spaced apart from each other; a transfer shaft 300 inserted into the horizontal channel 110 to reciprocate therein; a storage room 200 connected to an upper side of the pumping port 121; and a pumping unit 150 connected to a lower side of the pumping port 121. The apparatus may further include a reciprocating driving unit 500 connected to a side of the transfer block 100 to allow the transfer shaft 300 to be reciprocally driven.

The storage room 200 may include a canister body 210 for providing a predetermined space in which a powder source 10 is stored and a canister lid 220 covering an opening region of the canister body 210. The powder source 10 used as a deposition source, e.g., an organic source in the form of a solid powder in a process of depositing an organic thin film, is stored in the canister body 210. The canister lid 220 is separably or openably coupled to the top of the canister body 210. Accordingly, the powder source 10 can be easily input into the internal space of the canister body 210 by allowing the canister lid 220 to be separated or opened from the canister body 210. In addition, at least one discharge hole 250 through which the powder source 10 stored in the storage room is discharged to the outside is formed in one side of the storage room 200. Although not shown, a mixing unit which mixes the powder source 10 stored in the storage room 200 may be provided in the storage room 200. For example, a vibrator is provided in the canister body 210 so as to mix the powder source 10 at any time, thereby preventing conglomeration of the powder source 10. However, the mixing unit is not limited thereto but may be replaced by any unit which can mix the powder source 10 stored in the storage room 200, e.g., a screw unit. In addition, a first gas supply pipe 231 for supplying a first gas to the storage room 200 and a First gas exhaust pipe 241 for controlling the internal pressure of the storage room are connected at the other side of the storage room 200 so that the powder source is smoothly discharged. A first valve 232 and a second valve 242 are respectively installed to the first gas supply pipe 231 and the first gas exhaust pipe 241 so as to control gas flow in the first gas supply pipe and the first gas exhaust pipe. At this time, the first gas supply pipe 231 and the first gas exhaust pipe 241 may be configured to by partially shared with each other.

The transfer block 100 includes a horizontal channel 110 extending in one direction, e.g., a horizontal direction; and a pumping port 121 and a transfer port 131, which extend in the other direction, e.g., a vertical direction crossing the horizontal channel 110 and pass through the horizontal channel 110. The pumping port 121 is a passage where the powder source 10 stored in the storage room 200 is filled in a transfer hole 310 of the transfer shaft 300 and then quantified. An upper side of the pumping port communicates with the discharge hole 250 of the storage room 200 for supplying the powder source 10, and the lower side of the pumping port is connected to the pumping unit 150 for forming a compulsory discharge pressure in the storage room. In addition, a third valve 122 for controlling the discharge flow of the powder source is installed between the pumping port 121 and the pumping unit 150. A filter member 140 is inserted into the lower side of the pumping port 121. The filter member 140 has a plurality of micro-pores in the form of meshes so that the filter member allows the first gas to pass therethrough but the powder source 10 to be blocked. To this end, each of the micro-pores is preferably formed larger than the particle of the first gas and smaller than the particle of the powder source 10. The transfer port 131 is a passage through which the powder source 10 carried by a second gas is supplied to an external apparatus. An upper side of the transfer port communicates with a second gas supply unit (not shown) for supplying the second gas, and a lower side of the transfer port is connected to the external apparatus (not shown) to which the powder source 10 is supplied. In addition, a fourth valve 132 for controlling flow of the supplied second gas is preferably installed between the transfer port 131 and the second gas supply unit. The horizontal channel 110 and the pumping and transfer ports 121 and 131 may be formed by boring holes through a single member or by respectively boring holes through separate members and coupling them to each other.

Meanwhile, in order to prevent leakage of the first gas and the powder source 10 supplied into the horizontal channel 110 through the pumping port 121, first sealing members 410 such as quad-rings may be installed on an outer circumferential surface of the transfer shaft 300 inserted into the pumping port 121 and a second sealing member 420 such as a bellows may be installed on an outer side of an end of the horizontal channel 110 into which the transfer shaft 300 is inserted. Also, an inert gas such as Ar or N2 is preferably used as the first and second gases.

A portion of the transfer shaft 300 is inserted into the horizontal channel 110 and reciprocally driven in the horizontal channel 110. The transfer shaft 300 is provided with at least one transfer hole 310 which allows the powder source 10 supplied through the pumping port 121 to be loaded therein and to be transferred through the transfer port 131. At this time, the transfer hole 310 is positioned at the intersection point of the horizontal channel 110 and the pumping port 121 when the powder source 10 is loaded, and then moved to the intersection point of the horizontal channel 110 and the transfer port 131 when the powder source 10 is discharged. Preferably, the transfer shaft 300 has the outer diameter identical to or slightly smaller than the inner diameter of the horizontal channel 110, so that the transfer shaft is reciprocally driven while being rubbed against or supported by the inner wall of the horizontal channel 110. At this time, if the surface friction between the transfer shaft 300 and the horizontal channel 110 is too large, foreign materials may be generated by the surface friction. Therefore, at least one of them is preferably formed of a material having a low surface roughness. For example, the transfer shaft 300 may be formed of a ceramic material, the surface roughness of which can be lowered through surface treatment, or a fluorine resin material of the Teflon line, which has a self-lubricating property.

The reciprocating driving unit 500 having a cylinder 510 and a piston 520 reciprocally driven in the cylinder 510 are disposed at a side of the transfer block 100. One end of the transfer shaft 300 is connected to an end of the piston 520. The piston 520 has the outer diameter identical to or slightly smaller than the inner diameter of the cylinder 510, so that the piston is reciprocally driven while being rubbed against or supported by the inner wall of the cylinder 510. At this time, if only the piston 520 itself has not airtightness, a sealing member 530 such as a rubber ring is additionally installed on an outer circumferential surface of the piston 520, thereby improving the airtightness. In this embodiment, the reciprocating driving unit 500 is to allow the transfer shaft 300 inserted into the horizontal channel 110 to be reciprocally driven in the horizontal channel 110. For example, as shown in FIG. 1, the reciprocating driving unit 500 may be configured to operate in a pneumatic manner wherein a gateway 540 through which air flows in and out is formed at one side of the cylinder 510 so that the piston 520 operates according to a change in pressure in the cylinder 510. Alternatively, the reciprocating driving unit 500 may be configured to operate in a hydraulic manner wherein the piston 520 operates while fluid flows in and out through the gateway 540. In addition, the reciprocating driving unit 500 may be configured to be driven by a linear motor which enables a rotational movement to be converted into a linear movement.

The operation of the apparatus for supplying a source according to this embodiment so configured will be described as follows.

Figure 2:
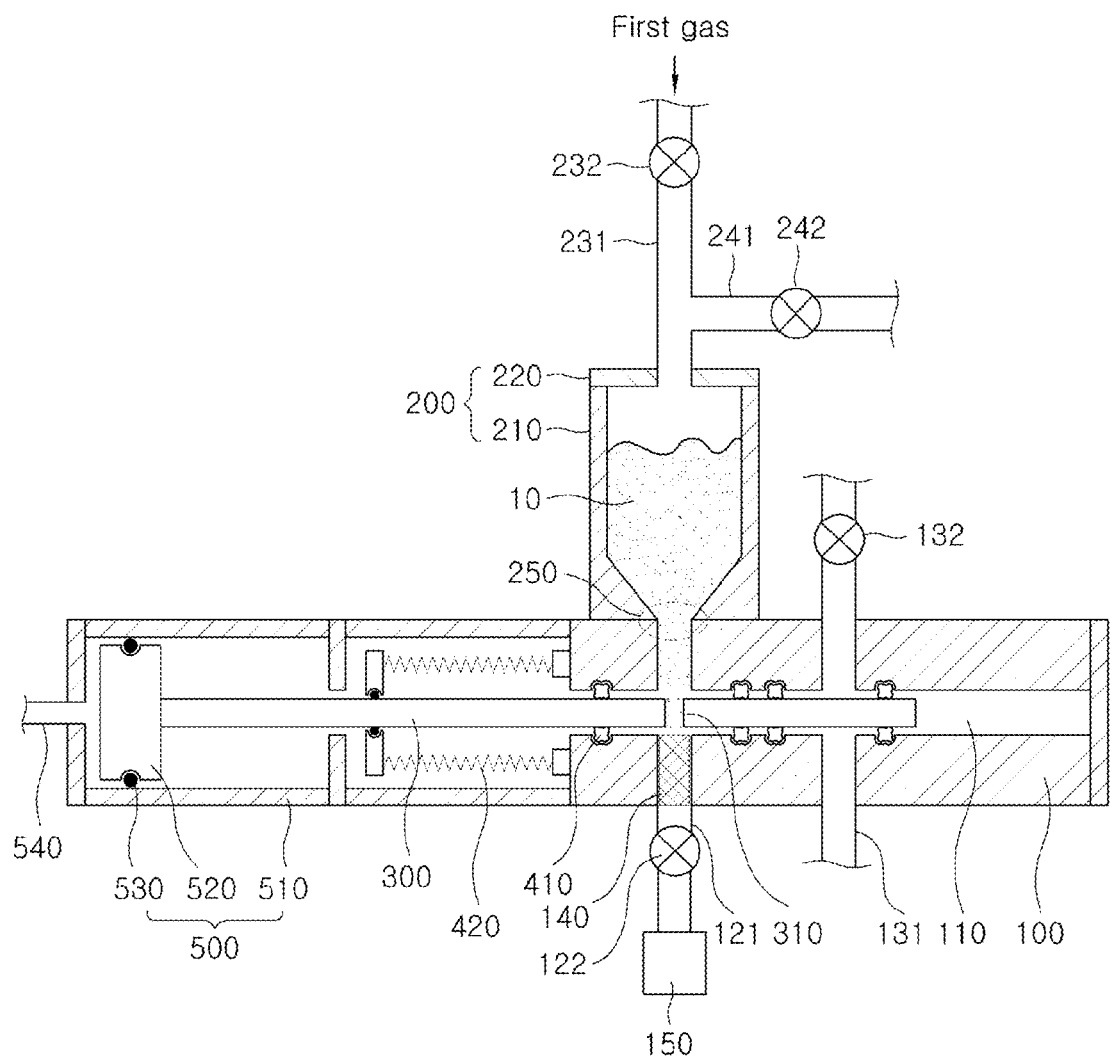
FIGS. 2 and 3 are schematic views illustrating the operation of the apparatus for supplying a source according to the first embodiment of the present invention.
Figure 3:
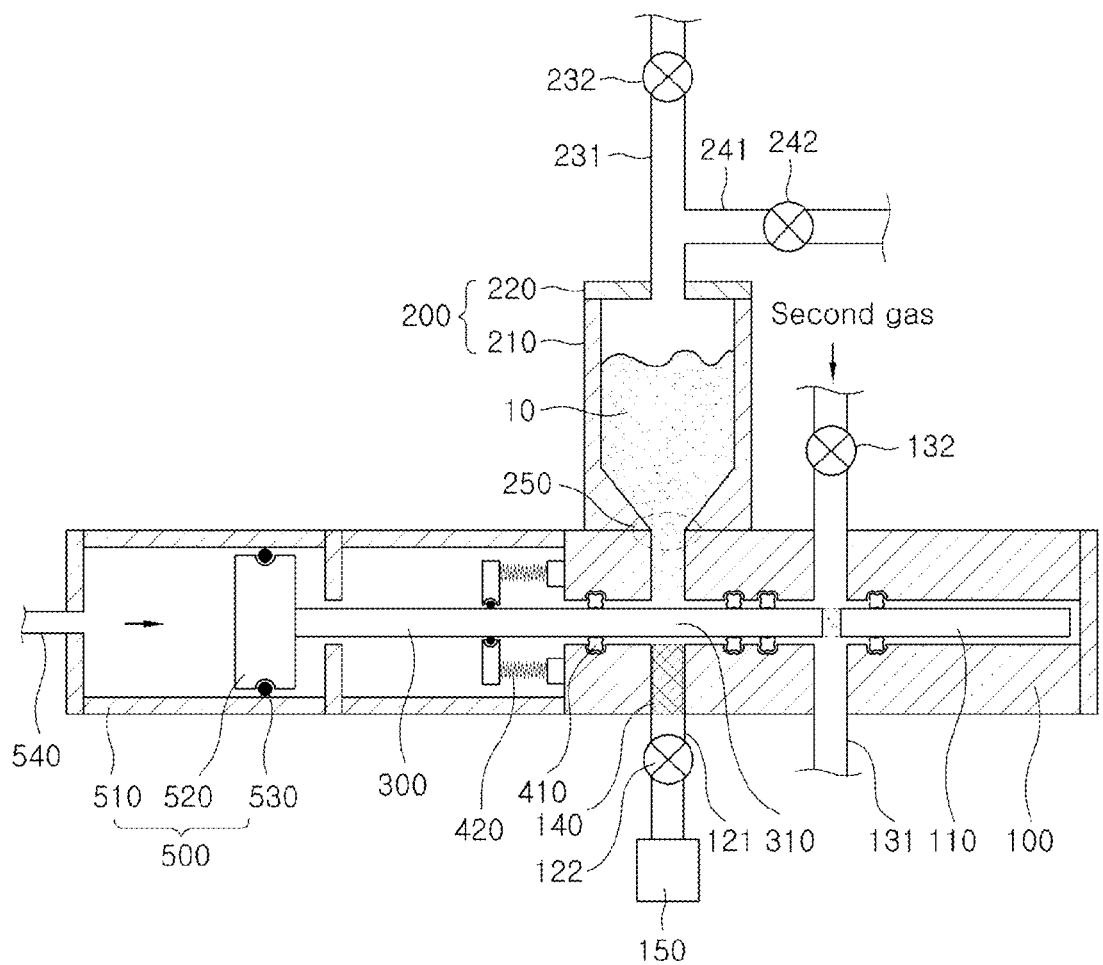

FIGS. 2 and 3 are schematic views illustrating the operation of the apparatus for supplying a source according to the first embodiment of the present invention.

First, as shown in FIG. 2, a predetermined amount of the powder source 10 is filled in the canister body 210 after separating the canister lid 220 from the canister body 210, and the canister lid 220 is then coupled to the canister body 210 again. At this time, the powder source 10 filled in the canister body 210 may be objected to any one of mixing, grinding and pressing processes such that the powder source 10 has a dense formation suitable for a thin-film deposition process. In the meantime, the transfer shaft 300 is moved so that the transfer hole 310 and the pumping port 121 are aligned in a colinear relationship, thereby allowing upper and lower portions of the closed pumping port 121 to communicate with each other. Subsequently, a first gas is supplied into the storage room 200 through the first gas supply pipe 231 by opening the first valve 232. If the internal pressure of the storage room 200 reaches a predetermined level, the third valve 122 is opened. Also, the discharge pressure in the pumping port 121 is formed by operating the pumping unit 150. Accordingly, the first gas and the powder source 10 are moved from the upper side to the lower side of the pumping port 121 due to gravity and the pressure difference between the inside and the outside of the storage room 200, and then, only the powder source 10 that does not pass through the filter member 140 is filled in the transfer hole 310. It will be apparent that only the powder source 10 of a fixed quantity corresponding to the internal volume of the transfer hole 310 is filled in the transfer hole 310.

Thereafter, as shown in FIG. 3, the transfer shaft 300 is moved so that the transfer hole 310 and the pumping port 121 are aligned in a colinear relationship, thereby allowing upper and lower portions of the closed pumping port 121 to communicate with each other. In the meantime, the upper side of the transfer port 131 is supplied with a second gas for transferring the powder source 10 to an external apparatus. Accordingly, the fixed quantity of the powder source 10 filled in the transfer hole 310 is mixed with the second gas, discharged through the lower side of the transfer port 131, and then supplied to the external apparatus requiring the powder source 10.

The following Table 1 illustrates experimental results of the supply amount of the powder source 10 supplied to an external apparatus using the apparatus for supplying a source according to the first embodiment of the present invention.

TABLE 1

| | Number of times | | | | | | | | | |
|---|---|---|---|---|---|---|---|---|---|---|
| | 1 | 2 | 3 | 4 | 5 | 6 | 7 | 8 | 9 | 10 |
| Supply quantity (g) | 0.202 | 0.229 | 0.208 | 0.225 | 0.227 | 0.215 | 0.249 | 0.213 | 0.212 | 0.231 |
| | Number of time | | | | | | | | | |
| | 11 | 12 | 13 | 14 | 15 | 16 | 17 | 18 | 19 | 20 |
| Supply quantity (g) | 0.241 | 0.221 | 0.246 | 0.214 | 0.258 | 0.243 | 0.230 | 0.234 | 0.243 | 0.234 |

Referring to Table 1, it can be seen that the average of twenty-time supply amounts of the powder source 10 is calculated at about 0.229 g. In this case, it can be seen that the standard deviation is 0.01511. In the experimental result, the reproducibility is 6.6%, which is very high, under the condition that the target supply amount of the powder source 10 is 0.200 g. Accordingly, the apparatus for supplying a source according to the present invention is suitable not only when supplying a large amount of powder source but also when supplying a very small amount of powder source.

As described above, according to the present invention, the amount of the powder source 10 supplied to the outside is quantitatively controlled as much as a fixed quantity corresponding to the internal volume of the transfer hole 310. Accordingly, if the transfer hole 310 is very finely machined to have a desired internal volume thereof, the amount of powder source can be quantitatively controlled not only when supplying a large amount of powder source but also when supplying a very small amount of powder source, e.g., some milligrams to some hundreds of milligrams.

<Second Embodiment>

Figure 4:
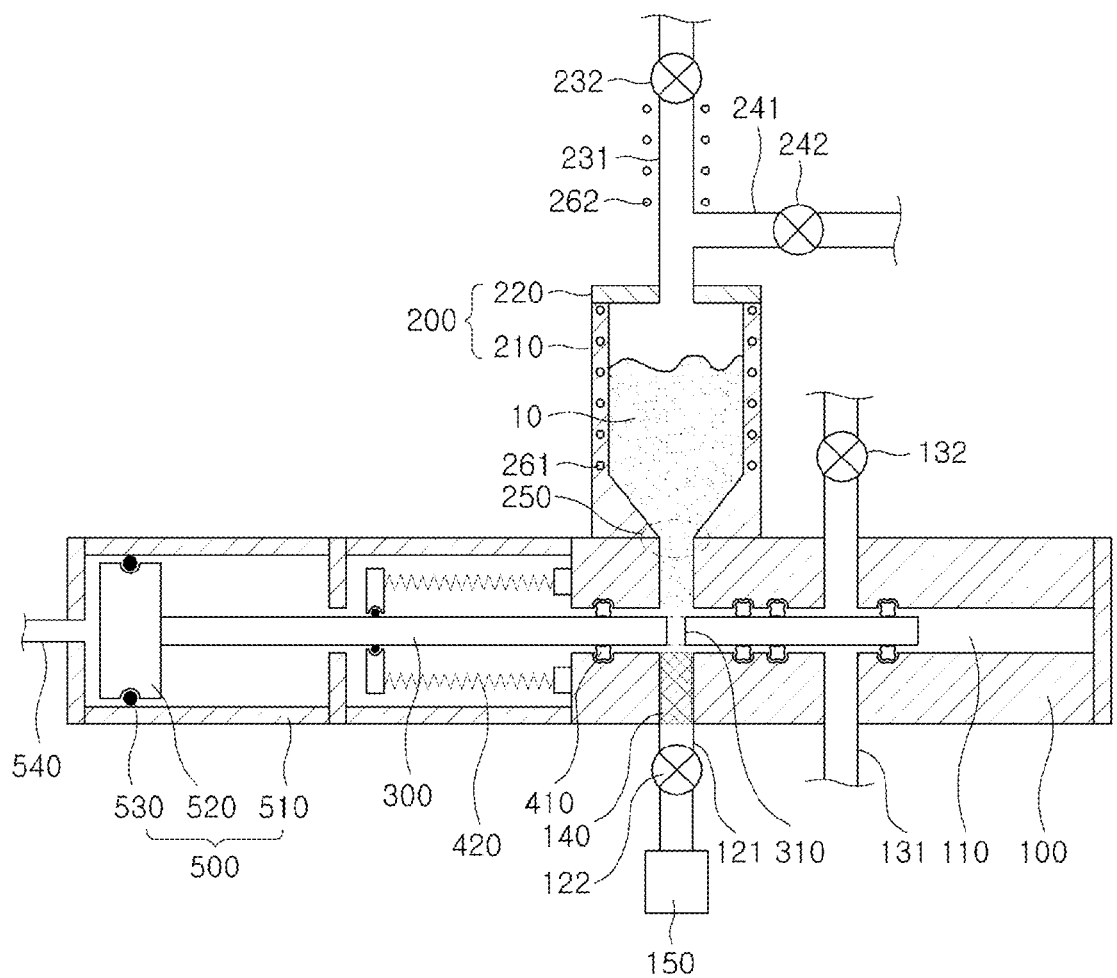
FIG. 4 is a schematic view of an apparatus for supplying a source according to a second embodiment of the present invention.

FIG. 4 is a schematic view of an apparatus for supplying a source according to a second embodiment of the present invention.

Referring to FIG. 4, the apparatus for supplying a source includes a transfer block 100 having a horizontal channel 110 extending in one direction and a pumping port 121 and a transfer port 131, which pass through the horizontal channel 110 to extend in the other direction and are spaced apart from each other; a transfer shaft 300 inserted into the horizontal channel 110 to reciprocate therein; a storage room 200 connected to an upper side of the pumping port 121; a pumping unit 150 connected to a lower side of the pumping port 121; and a first gas supply pipe 231 connected to a side of the storage room 200 to supply a First gas to the storage room 200 so that the powder source 10 is smoothly discharged. The apparatus may further include a first heating member 261 for heating the inside of the storage room 200 to a predetermined temperature and a second heating member 262 for heating the inside of the first gas supply pipe 231 to a predetermined temperature.

Here, the first heating member 261 heats the powder source 10 stored in the storage room 200 to a predetermined temperature, e.g., 100° C. or higher, and therefore, the moisture contained in the powder source 10 is removed, thereby making it possible to prevent conglomeration of the powder source 10 and therefore clogging of passages. The second heating member 262 heats the first gas to a predetermined temperature, e.g., 100° C. or higher, and therefore, the moisture contained in the first gas is removed, thereby making it possible to prevent the moisture from being supplied to the powder source 10. Accordingly, the moisture contained in the powder source 10 is minimized, thereby preventing conglomeration of the powder source 10 and therefore clogging of passages. Thus, even when the amount of the powder source 10 is very small, the amount of the powder source 10 can be quantitatively controlled and it can be supplied to an external apparatus. To this end, although not shown, a third heating member may be provided to heat at least one of the transfer port 131 and a second gas supply unit (not shown).

<Third Embodiment>

Figure 5:
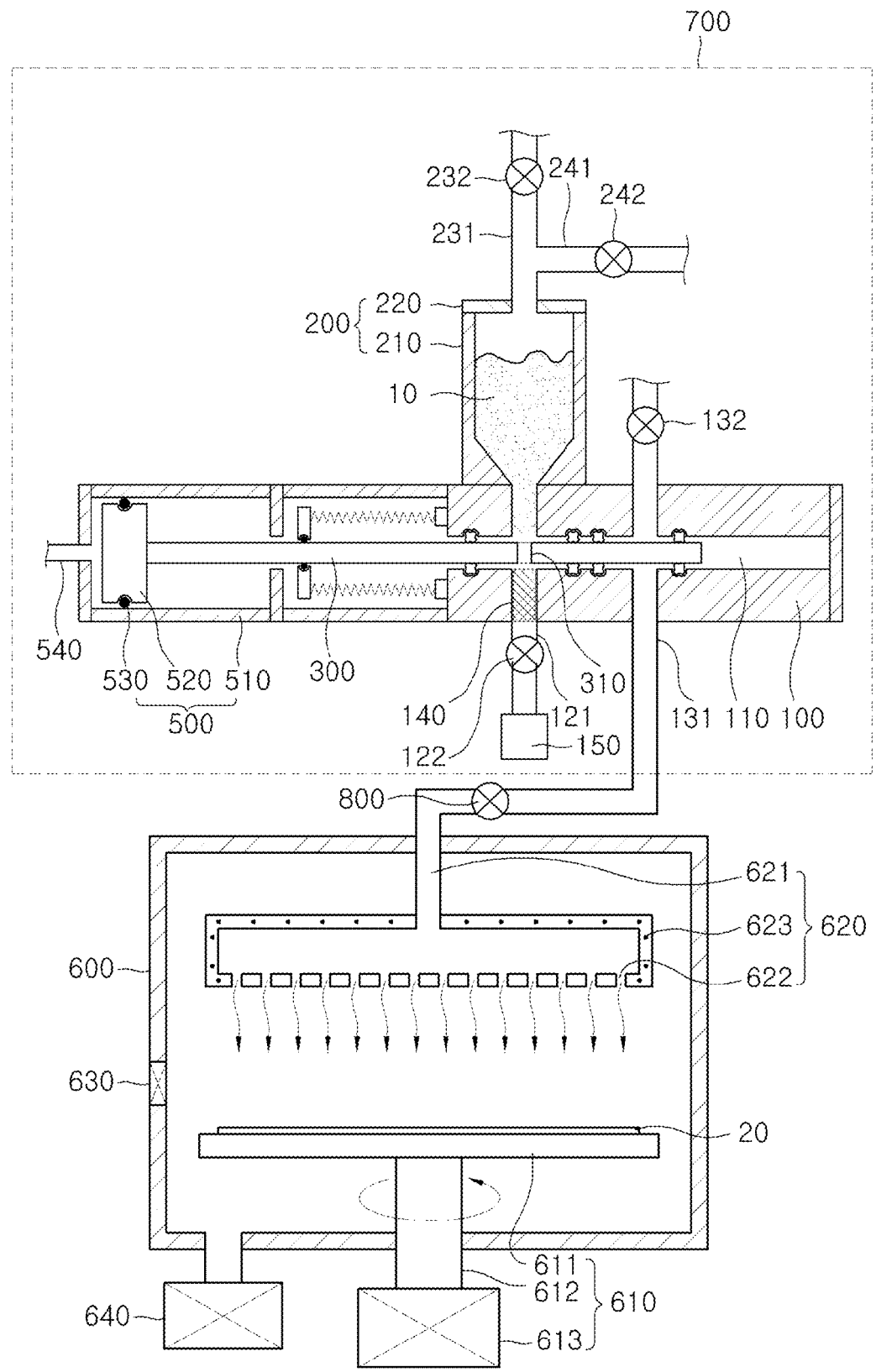
FIG. 5 is a schematic view of an apparatus for depositing a thin film having the apparatus for supplying a source according to the present invention.

FIG. 5 is a schematic view of an apparatus for depositing a thin film having an apparatus for supplying a source according to an embodiment of the present invention.

Referring to FIG. 5, the apparatus for depositing a thin film includes a chamber 600 in which a thin film is formed on a substrate 20 and a source supply unit 700 for supplying a thin film source to the chamber 600. An organic thin film is deposited on the substrate 20, and the source supply unit 700 supplies a powder organic source that is a material used in depositing an organic thin film.

The chamber 600 defines a predetermined closed reaction space. A substrate support unit 610 having a substrate seated thereon is provided in an inner lower portion of the chamber 600, and a source injection unit 620 is provided in an inner upper portion of the chamber 600 opposite to the substrate support unit 610. In addition, the chamber 600 may be provided with an opening/closing unit 630 for allowing a substrate to be loaded/unloaded, and an exhaust unit 640 for exhausting a gas from the chamber.

The substrate Support 610 includes a support 611 on which the substrate 20 is seated. A cooling unit for keeping the temperature of the substrate 20 constant or a heating unit for heating the substrate 20 to a process temperature may be provided in an outside or inside of the support 611. In addition, the support 611 may be configured to be lifted, lowered and rotated. For example, a rotary shaft 612 is coupled to a bottom of the support 611, and the rotary shaft 612 extends to the outside of the chamber 600 and is connected to a reciprocating driving unit 613 for applying rotational force to the rotary shaft 612. Accordingly, a thin film having a uniform thickness can be deposited on the entire surface of the substrate 20 by rotating the support 611.

The source injection unit 620 evaporates the powder source supplied from the source supply unit 700 and injects the evaporated source gas to the substrate 20. The source injection unit 620 includes a supply port 621 receiving the powder source 10; a nozzle unit 622 for injecting the source gas onto the substrate 20; and a heating unit 623 for evaporating the powder source 10 into the source gas. In this embodiment, a heating member 623, such as a heating coil or lamp heater, is embedded in a main body of the source injection unit 620. A powder source material 10 is heated by the heating member 623 and evaporated into a gaseous source material. However, the heating unit 623 is not limited thereto but may include a variety of heating members. In addition, the source injection unit 620 may be fixedly installed, but may be installed to a driving unit to rotate or move from side to side or back and forth. Accordingly, by adjusting the distance between the source injection unit 620 and the substrate 20, process conditions can be changed, and the source gas can be uniformly injected onto the entire surface of the substrate 20. Also, although not shown, a preheating unit for preheating the powder source 10 may be further provided between the source injection unit 620 and the source supply unit 700. Accordingly, the evaporation rate of the powder source 10 in the source injection unit 620 is increased, thereby making it possible to enhance the thin film deposition rate.

The source supply unit 700 includes a transfer block 100 having a horizontal channel 110 extending in one direction and a pumping port 121 and a transfer port 131, which pass through the horizontal channel 110 to extend in the other direction and are spaced apart from each other; a transfer shaft 300 inserted into the horizontal channel 110 to reciprocate therein; a storage room 200 connected to an upper side of the pumping port 121; and a pumping unit 150 connected to a lower side of the pumping port 121. The transfer shaft 300 is provided with at least one transfer hole 310 which is filled with the powder source 10, and configured so that the transfer hole 310 reciprocate between two points at which the transfer hole 310 is aligned in a colinear relationship with each of the pumping port 121 and the transfer port 131. Accordingly, the powder source 10 in the storage room 200 may be filled in the transfer hole 310 through the pumping port 121 and then transferred to the chamber 600 through the transfer port 121. At this time, the amount of the powder source 10 supplied to the chamber 600 is quantitatively controlled as much as a fixed quantity corresponding to the internal volume of the transfer hole 310. Accordingly, if the transfer hole 310 is very finely machined to have a desired internal volume thereof, the amount of powder source can be quantitatively controlled not only when supplying a large amount of powder source but also when supplying a very small amount of powder source, e.g., some milligrams to some hundreds of milligrams.

As described above, according to the present invention, it is possible to supply not only a large fixed amount of powder source but also a very small fixed amount of powder source. Accordingly, a thin-film deposition process can be stably performed, such as easily controlling the thickness of a thin film, thereby making it possible to efficiently manufacture high-quality thin-film products.

Meanwhile, although an apparatus for forming an organic thin film which is supplied with an organic material has been illustrated in the aforementioned embodiments, the present invention is not limited thereto but may be applied to any apparatus requiring the supply of a powder source.

According to the present invention, a powder source filled in a transfer hole is supplied to an external apparatus by reciprocating a transfer shaft, so that the amount of the powder source supplied to the external apparatus can be quantitatively controlled as much as a fixed quantity corresponding to the internal volume of the transfer hole.

Further, moisture contained in a powder source is removed by a heating unit and then supplied to an external apparatus, thereby preventing conglomeration of the powder source and therefore clogging of passages. Accordingly, it is possible to supply not only a large fixed amount of powder source but also a very small fixed amount of powder source.

Furthermore, according to the present invention, it is possible to supply not only a very small amount of powder source but also a fixed amount of powder source. Accordingly, a thin film deposition process can be stably performed, such as easily controlling the thickness of a thin film, thereby making it possible to efficiently manufacture high-quality thin-film products.

Although the present invention has been described in connection with the accompanying drawings and the aforementioned embodiments, the present invention is not limited thereto but defined by the appended claims. Accordingly, it will be understood by those skilled in the art that various modifications and changes can be made thereto without departing from the spirit and scope of the invention defined by the appended claims.

What is claimed is:

1. An apparatus for supplying a source, comprising:
   a horizontal channel extending in one direction;
   pumping and transfer ports extending to pass through the horizontal channel, the pumping and transfer ports being spaced apart from each other;
   a transfer shaft inserted into the horizontal channel to reciprocate therein; and
   a storage room connected to one side of the pumping port, the storage room storing and supplying a powder source; and
   a source injection unit configured to evaporate the powder source,
   wherein the transfer shaft comprises at least one transfer hole for allowing the powder source supplied through the pumping port to be filled therein and to be transferred to the source injection unit through the transfer port.

2. The apparatus as claimed in claim 1, further comprising a pumping unit connected to a side of the horizontal channel opposite the pumping port to form discharge pressure.

3. The apparatus as claimed in claim 2, wherein a valve for controlling discharge flow of the powder source is installed between the pumping port and the pumping unit.

4. The apparatus as claimed in claim 1, further comprising a gas supply unit connected to one side of the transfer port to supply a gas for transferring the powder source.

5. The apparatus as claimed in claim 1, wherein a first sealing member is installed on an outer circumferential surface of the transfer shaft inserted into the horizontal channel, and a second sealing member is installed on an outer side of an end of the horizontal channel into which the transfer shaft is inserted.

6. The apparatus as claimed in claim 1, wherein the transfer shaft is formed of a ceramic or teflon material.

7. The apparatus as claimed in claim 1, further comprising a reciprocating driving unit connected to one end of the transfer shaft and reciprocally driving the transfer shaft.

8. The apparatus as claimed in claim 7, wherein the reciprocating driving unit comprises a pneumatic piston member.

9. The apparatus as claimed in claim 1, further comprising a gas supply unit for supplying a gas for discharging the powder source into the storage room.

10. The apparatus as claimed in claim 9, further comprising a heating member for heating at least one of the storage room and the gas supply unit.

11. The apparatus as claimed in claim 10, wherein the heating member has a heating temperature of 100° C. or higher.

* * * * *